United States Patent
Small

(10) Patent No.: US 9,793,874 B2
(45) Date of Patent: Oct. 17, 2017

(54) ACOUSTIC RESONATOR WITH ELECTRICAL INTERCONNECT DISPOSED IN UNDERLYING DIELECTRIC

(71) Applicant: Avago Technologies General IP (Singapore) Pte. Ltd., Singapore (SG)

(72) Inventor: Martha K. Small, Fort Collins, CO (US)

(73) Assignee: AVAGO TECHNOLOGIES GENERAL IP SINGAPORE (SINGAPORE) PTE. LTD., Singapore (SG)

( * ) Notice: Subject to any disclaimer, the term of this patent is extended or adjusted under 35 U.S.C. 154(b) by 526 days.

(21) Appl. No.: 14/289,568

(22) Filed: May 28, 2014

(65) Prior Publication Data

US 2015/0349745 A1 Dec. 3, 2015

(51) Int. Cl.
| | | |
|---|---|---|
| H03H 9/17 | (2006.01) | |
| H03H 3/02 | (2006.01) | |
| H03H 9/10 | (2006.01) | |
| H03H 9/205 | (2006.01) | |
| H03H 9/58 | (2006.01) | |
| H03H 9/05 | (2006.01) | |

(52) U.S. Cl.
CPC ............ *H03H 9/171* (2013.01); *H03H 3/02* (2013.01); *H03H 9/1007* (2013.01); *H03H 9/174* (2013.01); *H03H 9/205* (2013.01); *H03H 9/588* (2013.01); *H03H 9/0561* (2013.01); *Y10T 29/43* (2015.01)

(58) Field of Classification Search
CPC ...... H03H 9/171; H03H 9/1007; H03H 9/174; H03H 9/205; H03H 9/0561

USPC .................................... 310/320, 321, 324
See application file for complete search history.

(56) References Cited

U.S. PATENT DOCUMENTS

| | | | |
|---|---|---|---|
| 5,587,620 A | 12/1996 | Ruby et al. | |
| 5,714,917 A * | 2/1998 | Ella ................. | H03C 1/46 310/318 |
| 5,873,153 A | 2/1999 | Ruby et al. | |
| 6,107,721 A | 8/2000 | Lakin | |
| 6,228,675 B1 | 5/2001 | Ruby et al. | |
| 6,265,246 B1 | 7/2001 | Ruby et al. | |
| 6,384,697 B1 | 5/2002 | Ruby | |
| 6,429,511 B2 | 8/2002 | Ruby et al. | |
| 6,507,983 B1 | 1/2003 | Ruby et al. | |
| 6,787,897 B2 | 9/2004 | Geefay et al. | |
| 6,919,222 B2 | 7/2005 | Geefay | |
| 6,979,597 B2 | 12/2005 | Geefay et al. | |
| 7,161,283 B1 | 1/2007 | Geefay | |
| 7,280,007 B2 | 10/2007 | Feng et al. | |

(Continued)

OTHER PUBLICATIONS

Christian C. Enz, et al., et. al., eds., "MEMS based circuits and systems for wireless communication", Integrated Circuits and Systems.

(Continued)

*Primary Examiner* — Derek Rosenau

(57) ABSTRACT

An apparatus comprises a substrate, a dielectric disposed on the semiconductor substrate, an acoustic resonator disposed on the dielectric, and an electrical interconnect disposed in the dielectric and configured to transmit an electrical signal to or from at least one electrode of the acoustic resonator through a signal path disposed at least partially below a level of the acoustic resonator.

12 Claims, 9 Drawing Sheets

(56) References Cited

U.S. PATENT DOCUMENTS

| | | | |
|---|---|---|---|
| 7,388,454 B2 | 6/2008 | Ruby et al. | |
| 7,408,287 B2 * | 8/2008 | Matsumoto | H03H 3/04 310/320 |
| 7,608,470 B2 | 10/2009 | Talalaevski et al. | |
| 7,629,865 B2 | 12/2009 | Ruby | |
| 2007/0205850 A1 | 9/2007 | Jamneala et al. | |
| 2010/0327697 A1 | 12/2010 | Choy et al. | |
| 2010/0327994 A1 | 12/2010 | Choy et al. | |
| 2011/0121916 A1 | 5/2011 | Barber et al. | |
| 2012/0126912 A1 * | 5/2012 | Tsutsumi | H03H 9/0566 333/132 |
| 2013/0049888 A1 | 2/2013 | Ruby | |
| 2013/0147319 A1 * | 6/2013 | Adkisson | H03H 9/173 310/340 |
| 2013/0194057 A1 | 8/2013 | Ruby | |
| 2013/0335166 A1 | 12/2013 | Sinha et al. | |

OTHER PUBLICATIONS

Co-pending U.S. Appl. No. 14/262,785, filed Apr. 27, 2014.
Ann Witvrouw, et al., "CMOS-MEMS Integration: Why, How and What?", ICCAD'06, Nov. 5-9, 2006, San Jose, CA.

* cited by examiner

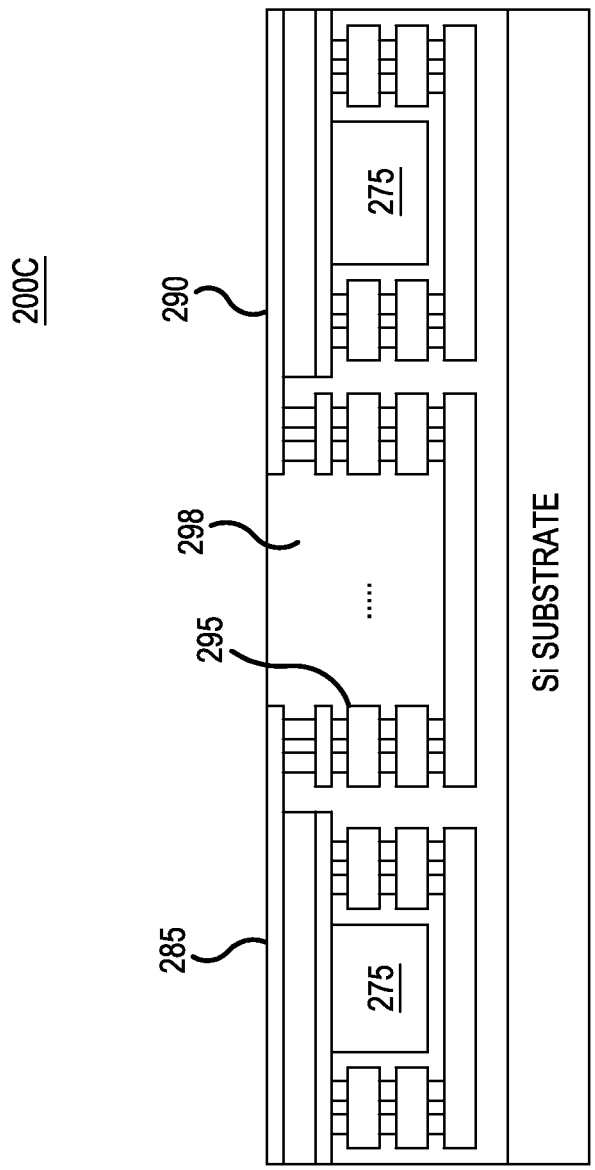

ACOUSTIC RESONATOR WITH ELECTRICAL INTERCONNECT DISPOSED IN UNDERLYING DIELECTRIC

BACKGROUND

Acoustic resonators are used to process radio frequency (RF) electrical signals in various electronic applications. For example, acoustic resonators are often used as bandpass filters in cellular phones, global positioning system (GPS) devices, and imaging applications, to name but a few. Common forms of acoustic resonators include, for instance, bulk acoustic wave (BAW) devices, surface acoustic wave (SAW) devices, thin film bulk acoustic resonator (FBAR) devices, double bulk acoustic resonator (DBAR) devices, and coupled resonator filter (CRF) devices.

FIGS. 1A through 1C are simplified diagrams of FBAR devices and are presented in order to illustrate certain principles of operation and construction that may apply to acoustic resonators more generally. In particular, FIG. 1A is a top view of an acoustic resonator 100, FIG. 1B is a cross-sectional view of acoustic resonator 100, taken along a line A-A', and FIG. 1C is a cross-sectional view of an acoustic resonator 100', which is a variation of acoustic resonator 100.

Referring to FIG. 1A, acoustic resonator 100 comprises a top electrode 125 having five (5) sides, with a connection side 101 configured to provide an electrical connection to electrical interconnect 102. Electrical interconnect 102 provides electrical signals to top electrode 125 to excite desired acoustic waves in a piezoelectric layer (not shown in FIG. 1A) of acoustic resonator 100. In alternative implementations, acoustic resonator 100 may have a different number of sides, i.e., less than 5 or greater than 5.

Referring to FIG. 1B, acoustic resonator 100 comprises an acoustic stack formed by a piezoelectric layer 120 disposed between a bottom electrode 115 and top electrode 125. The designations top electrode and bottom electrode are for convenience of explanation, and they do not represent any limitation with regard to the spatial arrangement, positioning, or orientation of acoustic resonator 100. The acoustic stack is disposed on a substrate 105 over an air cavity 110.

During typical operation, an electric field is applied between bottom electrode 115 and top electrode 125 of acoustic resonator 100. In response to this electrical field, the reciprocal or inverse piezoelectric effect causes acoustic resonator 100 to mechanically expand or contract depending on the polarization of the piezoelectric material. The presence of air cavity 110 prevents substrate 105 from absorbing mechanical energy of the expansion or contraction. As the electrical field varies over time, acoustic waves are generated in piezoelectric layer 120, and these acoustic waves propagate through acoustic resonator 100.

The frequency response of acoustic resonator 100 is determined by resonant frequencies of those propagating waves, which are influenced by the physical and electrical properties of acoustic stack and substrate 105, such as their dimensions, composition, impedance, mechanical stability, and so on. Accordingly, in an effort to improve the performance of acoustic resonators, researchers have explored various alternative ways of adjusting these and other properties. As one example, FIG. 1C shows a shows a variation of acoustic resonator 100 in which an acoustic stack is formed on a pedestal within an air cavity 110'. The pedestal structure mechanically and thermally isolates the acoustic stack from surrounding structures, which reduces the impact of mechanical stress on the membrane.

Referring to FIG. 1C, a substrate 105' has an air cavity 110' formed around a pedestal, and the acoustic stack comprises a bottom electrode 115', a piezoelectric layer 120', and a top electrode 125'. An interconnect layer 130' extends along a bottom surface of air cavity 110' to enable connection of the acoustic stack to external contacts, e.g., at connection side 101.

In general, electrical interconnects such as that provided by the extended bottom electrode 115', or alternatively interconnections between different electrodes of a device or between different devices, may occupy an undesirably high amount of available device space, and they may also adversely affect performance of the acoustic resonators.

In view of these and other shortcomings of conventional interconnect technologies, there is a general need for electrical interconnection structures occupying a reduced amount of space and avoiding a negative impact on performance.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 2C is a cross-sectional view of an apparatus comprising an FBAR according to a representative embodiment.

DETAILED DESCRIPTION

Figure 1A:
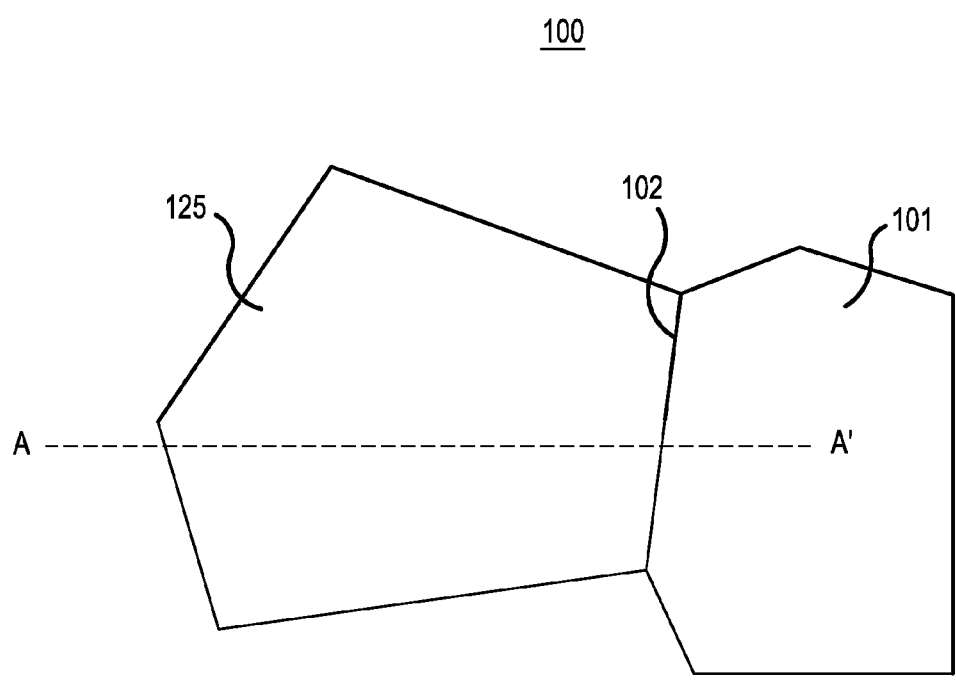
FIG. 1A is a top view of an apparatus comprising an FBAR.
Figure 1B:
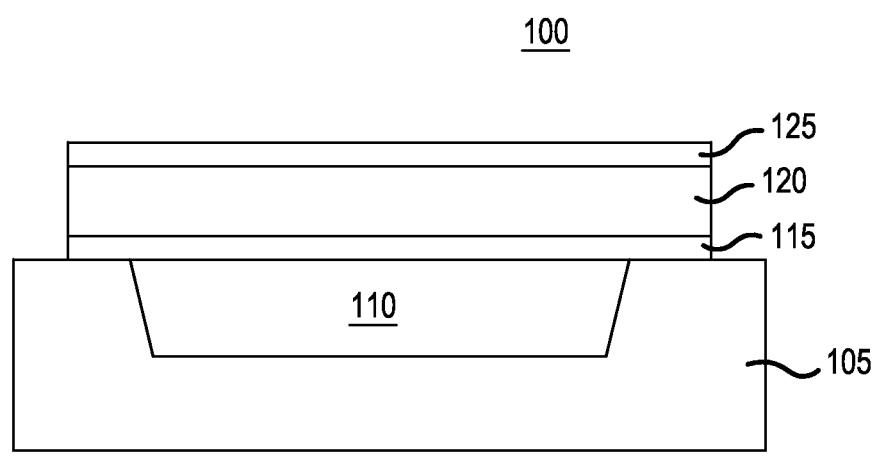
FIG. 1B is a cross-sectional view of the apparatus of FIG. 1B.
Figure 1C:
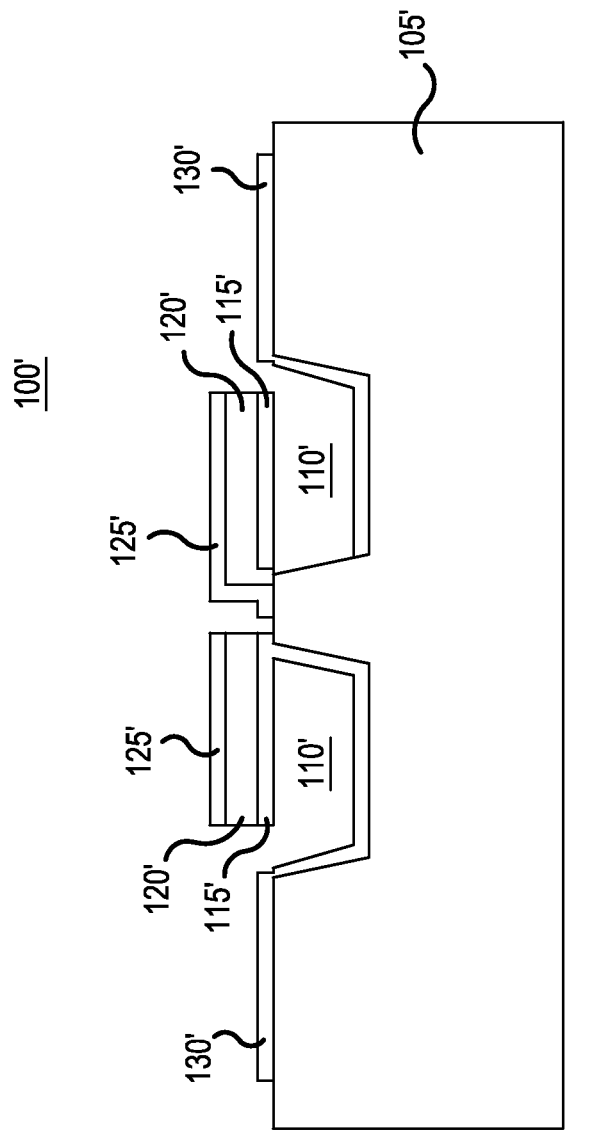
FIG. 1C is a cross-sectional view of another apparatus comprising an FBAR.

In the following detailed description, for purposes of explanation and not limitation, example embodiments disclosing specific details are set forth in order to provide a thorough understanding of various embodiments according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices. As used in the specification and appended claims, and in addition to their ordinary meanings, the terms 'substantial' or 'substantially' mean to within acceptable limits or degree. As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element.

The described embodiments relate generally to apparatuses comprising acoustic resonators and related methods of manufacture. In certain embodiments, one or more electrodes of an acoustic resonator are connected to one or more other electrically conductive features via an interconnect structure disposed in a dielectric (e.g., silicon dioxide) below the acoustic resonator. The interconnect structure and dielectric can be formed by typical integrated circuit (IC) processing technologies, such as aluminum metallization with tungsten filled vias or damascene metallization processes.

Some embodiments will be described with reference to an apparatus comprising an FBAR. However, the described concepts can be applied to acoustic resonators of various forms, such as, for example, FBARs, BAWs, DBARs, and CRFs. Additionally, in certain embodiments, multiple acoustic resonators can be used in combination to form devices such as electrical filters (e.g., ladder filters).

Certain details of acoustic resonators, materials constituting the acoustic resonators, and related methods of manufacture may be found in one or more of the following commonly owned U.S. patents, patent application Publications, and patent applications: U.S. Pat. No. 6,107,721, to Lakin; U.S. Pat. Nos. 5,587,620, 5,873,153 and 6,507,983 to Ruby, et al.; U.S. Pat. No. 7,629,865 to Ruby; U.S. Pat. No. 7,280,007 to Feng, et al.; U.S. Patent Application Publication 20070205850 to Jamneala, et al.; U.S. Pat. No. 7,388,454 to Ruby, et al; U.S. Patent Application Publication 2010/0327697 to Choy, et al.; and U.S. Patent Application Publication 2010/0327994 to Choy, et al. The disclosures of these patents and patent applications are specifically incorporated herein by reference as if set forth herein. It is emphasized that the components, materials and method of fabrication described in these patents and patent applications are representative and other methods of fabrication and materials within the purview of one of ordinary skill in the art are contemplated.

According to one representative embodiment, an apparatus comprises a high-resistivity substrate, typically silicon, a dielectric disposed on the substrate, an acoustic resonator (e.g., an FBAR) disposed on the dielectric, and an electrical interconnect disposed in the dielectric and configured to transmit an electrical signal to or from at least one electrode of the acoustic resonator through a signal path disposed at least partially below the level of the acoustic resonator. The electrical interconnect may comprise, for example, a plurality of metal layers and vias stacked within the dielectric, and it may be manufactured using CMOS or damascene process technology.

The electrical interconnect may connect an electrode of the acoustic resonator to an electrode of another acoustic resonator disposed on the dielectric. The acoustic resonator and the other acoustic resonator may be, for example, part of a ladder filter comprising multiple acoustic resonators disposed on the dielectric.

In certain related embodiments, the acoustic resonator is disposed on a pedestal structure within an air cavity in the dielectric. In such embodiments, the electrical interconnect may be connected to the acoustic resonator through the pedestal. Moreover, the acoustic resonator may have an annular shape with an opening at its center, and a top electrode of the acoustic resonator may be connected to the electrical interconnect through the opening.

In another representative embodiment, a method comprises forming a dielectric on a semiconductor substrate, forming an acoustic resonator (e.g., an FBAR) on the dielectric, and forming an electrical interconnect in the dielectric, wherein the electrical interconnect is configured to transmit an electrical signal to or from at least one electrode of the acoustic resonator through a signal path disposed at least partially below the level of the acoustic resonator. The forming of the dielectric may comprise, for example, depositing successive layers of dielectric material over the semiconductor substrate to encompass successive layers of the electrical interconnect. The forming of the electrical interconnect in the dielectric may comprise, for example, forming successive metal layers (e.g., aluminum or copper) and intervening metal vias (e.g., tungsten or copper).

In certain related embodiments, forming the acoustic resonator on the dielectric comprises forming a sacrificial material within a cavity in the dielectric, forming the acoustic resonator on the dielectric and the sacrificial material, and removing the sacrificial material to create a cavity below the acoustic resonator. The removing of the sacrificial material may comprise, for example, immersing the dielectric and the acoustic resonator in an acid such as hydrofluoric acid (HF). A polysilicon sacrificial material could be removed by a xenon difluoride ($XeF_2$) plasma etch.

In certain related embodiments, the method further comprises forming another acoustic resonator on the dielectric, wherein the electrical interconnect connects an electrode of the acoustic resonator to an electrode of the another acoustic resonator. The acoustic resonator and the other acoustic resonator may be part of, e.g., a ladder filter comprising multiple acoustic resonators disposed on the dielectric.

Figure 2A:
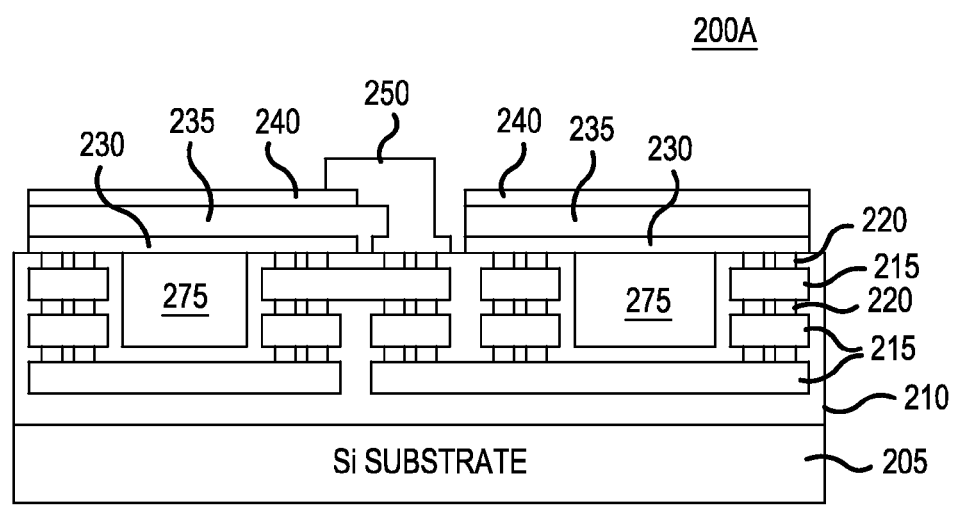
FIG. 2A is a cross-sectional view of an apparatus comprising multiple FBARs according to a representative embodiment.
Figure 2B:
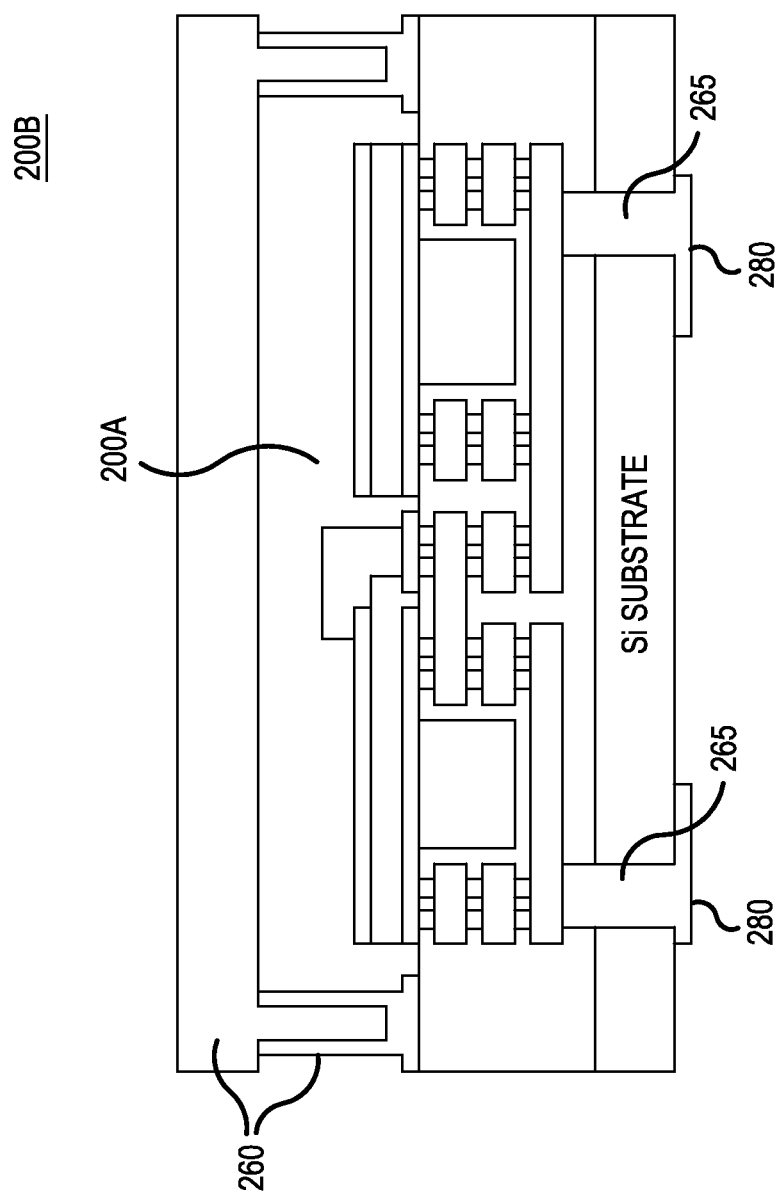
FIG. 2B is a cross-sectional view of an apparatus comprising multiple FBARs according to a representative embodiment.

FIGS. 2A through 2C are cross-sectional views of different apparatuses comprising multiple FBARs according to representative embodiments. FIG. 2A is a cross-sectional view of an apparatus 200A comprising two FBARs disposed over a substrate and a bottom electrical interconnect disposed between the FBARs and the substrate. FIG. 2B is a cross-sectional view of an apparatus 200B, which is a variation of apparatus 200A with a microcap structure and backside vias. FIG. 2C is a cross-sectional view of an apparatus 200C, which is a variation of apparatus 200A in which the two FBARs are separated by intervening structures.

Referring to FIG. 2A, apparatus 200A comprises a substrate 205, a dielectric 210 having an air cavity 275, a bottom electrical interconnect comprising metal layers 215 and vias 220, two FBARs each comprising a bottom electrode 230, a piezoelectric layer 235, and a top electrode 240, and a top electrical interconnect 250 disposed on a portion of one of the two FBARs. Each of the two FBARs is suspended over a different air cavity 275.

Substrate 205 is an electrical insulator. It is typically made of silicon for convenience of processing, as it is generally inexpensive and may have high resistivity, although other embodiments may use a different type of high impedance substrate. In the illustrated embodiment, the silicon is not used for its semiconductor properties. In fact, these properties present a potential liability, as any conductivity in the substrate may degrade the resonator performance.

Bottom and top electrodes 230 and 240 may be formed of any of various types of available conductive materials known to those of ordinary skill in the art, such as Al, Cu, W, Mo, Pt, Ru, Nb, or Hf, to name but a few. Additionally, the electrodes and other features of the FBARs may be modified or accompanied by additional features not shown in the drawings, such as temperature compensation features, air bridges, collars, frames, and others as may be appreciated by those of ordinary skill in the art.

Piezoelectric layer 235 can be a thin film comprising one or more of various alternative materials. For instance, it can comprise aluminum nitride (AlN) or zinc oxide (ZnO). Moreover, in certain embodiments, piezoelectric layer 235 may be doped with scandium or another rare-earth element to improve certain aspects of its performance. The atomic percentage of scandium in an aluminum nitride layer may be approximately 0.5% to less than approximately 10.0%. More generally, the atomic percentage of scandium in the piezoelectric layer 235 comprising an aluminum nitride layer is approximately 0.5% to approximately 44% in certain embodiments. In yet other embodiments, the atomic percentage of scandium in an aluminum nitride layer is approximately 2.5% to less than approximately 5.0%. When percentages of doping elements in a piezoelectric layer are discussed herein, it is in reference to the total atoms of the piezoelectric layer. Notably, when the percentage of doping elements (e.g., Sc) in a doped AlN layer are discussed herein, it is in reference to the total atoms (not including nitrogen) of piezoelectric layer 235. So, for example, and as described for example in U.S. patent application Ser. No. 14/161,564, which is hereby incorporated by reference, if the Al in the piezoelectric layer of a representative embodiment has an atomic percentage of approximately 95.0%, and the Sc has an atomic percentage of approximately 5.0%, then atomic consistency of the piezoelectric layer may be represented as $Al_{0.95}Sc_{0.05}N$.

It is noted that the use of scandium as the doping element is merely illustrative, and other rare-earth elements are contemplated for use as the doping element of the piezoelectric layer 227. Notably, other rare-earth elements including yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu), as known by one of ordinary skill in the art. The various embodiments contemplate incorporation of any one or more rare-earth elements, although specific examples are discussed herein.

The bottom electrical interconnect may be designed to route signals to an arbitrary location. For example, they may be designed to route signals from bottom electrodes 225 to a connection side of corresponding FBARs, or to electrodes of other FBARs. Moreover, they may be used to route the signals to proximate locations, such as adjacent components, or they may be used to route the signals to more distant locations.

The bottom electrical interconnect can be manufactured using CMOS processing techniques such as various forms of deposition, etching, planarization, and so on. In the illustrated example, metal layers 215 may be formed of a metal material such as aluminum, and vias 220 may be formed of a metal material such as tungsten. In certain alternative embodiments (e.g., those using damascene metallization), the aluminum layers and tungsten vias may be replaced by copper layers and copper vias. As will be appreciated by those of ordinary skill in the art, structures formed by damascene metallization or other alternative techniques may require different processing steps than the illustrated embodiments.

Dielectric 210 encompasses the bottom electrical interconnect, and it is formed of a non-etchable material that protects the electrical interconnect from damage when air cavities 275 is formed or when other processing steps are performed. In addition to (or as an alternative to) forming dielectric 210 of a non-etchable material, a layer of protective material may also be formed over dielectric 210 to prevent it from being degraded during the removal of the sacrificial material or other processing steps used to produce the FBARs. Examples of such a protective material include heavily doped borosilicate glass or silicon carbide.

Air cavities 275 are typically formed by depositing a sacrificial material in corresponding spaces prior to the formation of the FBARs illustrated in FIG. 2A and then removing the sacrificial material after the formation of the FBARs. The removal of the sacrificial material typically comprises immersion of the structure comprising the FBARs in an acid bath, e.g., HF. Accordingly, to protect the bottom electrical interconnect, dielectric 210 should generally be formed of a material that will not etched by the HF or other substance used to remove the sacrificial material. Examples of such materials include borosilicate glass with a high boron concentration.

The formation of air cavities 275 may be accomplished by known methods, with certain relevant concepts described in U.S. Pat. No. 6,384,697 to Ruby et al., which is hereby incorporated by reference. As an alternative to air cavities 275, apparatus 200A or other embodiments may include one or more acoustic isolators (not shown), such as acoustic mirrors or Bragg Reflectors. Such acoustic isolators may be formed using techniques that would be apparent to one of ordinary skill in the art, with certain relevant concepts for manufacturing acoustic mirrors for a resonator device described in U.S. Patent App. Pub. No. 2011/0121916 to Barber et al., which is hereby incorporated by reference.

Referring to FIG. 2B, apparatus 200B comprises a microcap structure 260 disposed on dielectric 210 over apparatus 200A, and backside vias 265 penetrating substrate 205 and providing an electrical connection between metal layers 215 and backside pads 280. Additional details of methods, materials and assembly of a microcap structure to a base substrate may be found, for example in one or more of commonly owned U.S. Pat. Nos. 6,228,675; 6,265,246;

6,429,511; 6,787,897; 6,919,222; 6,979,597; and 7,161,283, the disclosures of which are hereby incorporated by reference.

Referring to FIG. 2C, an electrical interconnect 295 within a dielectric 298 can be used to route signals from a first acoustic resonator 285 to a second acoustic resonator 290 or some other device disposed on dielectric 210. As indicated by ellipses in FIG. 2C, the two acoustic resonators may be separated by an arbitrary distance and intervening structures.

Figure 3:
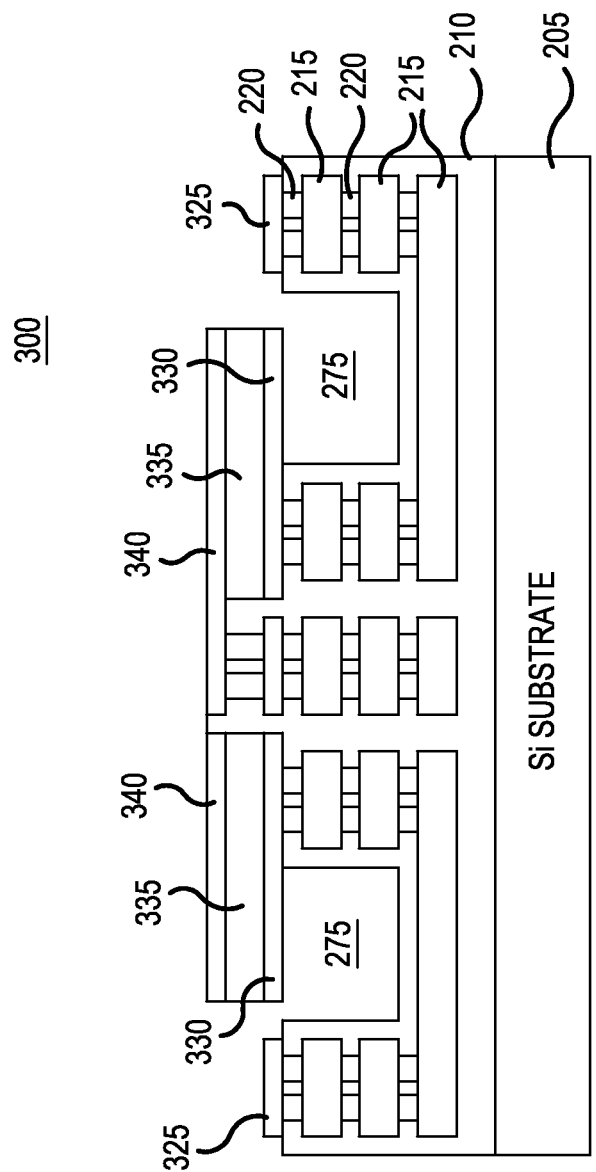
FIG. 3 is a cross-sectional view of an apparatus comprising an FBAR according to a representative embodiment.

FIG. 3 is a cross-sectional view of an apparatus 300 comprising an FBAR according to a representative embodiment.

Referring to FIG. 3, apparatus 300 has many features similar to those of apparatus 200A, except that rather than two FBARs, it has a single FBAR supported at its center and disposed on a pedestal formed by a portion of dielectric 210 and the electrical interconnect. The single FBAR comprises a bottom electrode 330, a piezoelectric layer 335, and a top electrode 340. Bottom electrode 330 is connected, via the bottom electrical interconnect, to interconnect pads 325 disposed on dielectric 210. Certain principles of pedestal design and manufacture are provided in commonly owned U.S. Patent Publication No. 2013/0049888 filed on Feb. 28, 2013, the disclosure of which is hereby incorporated by reference.

Figure 4:
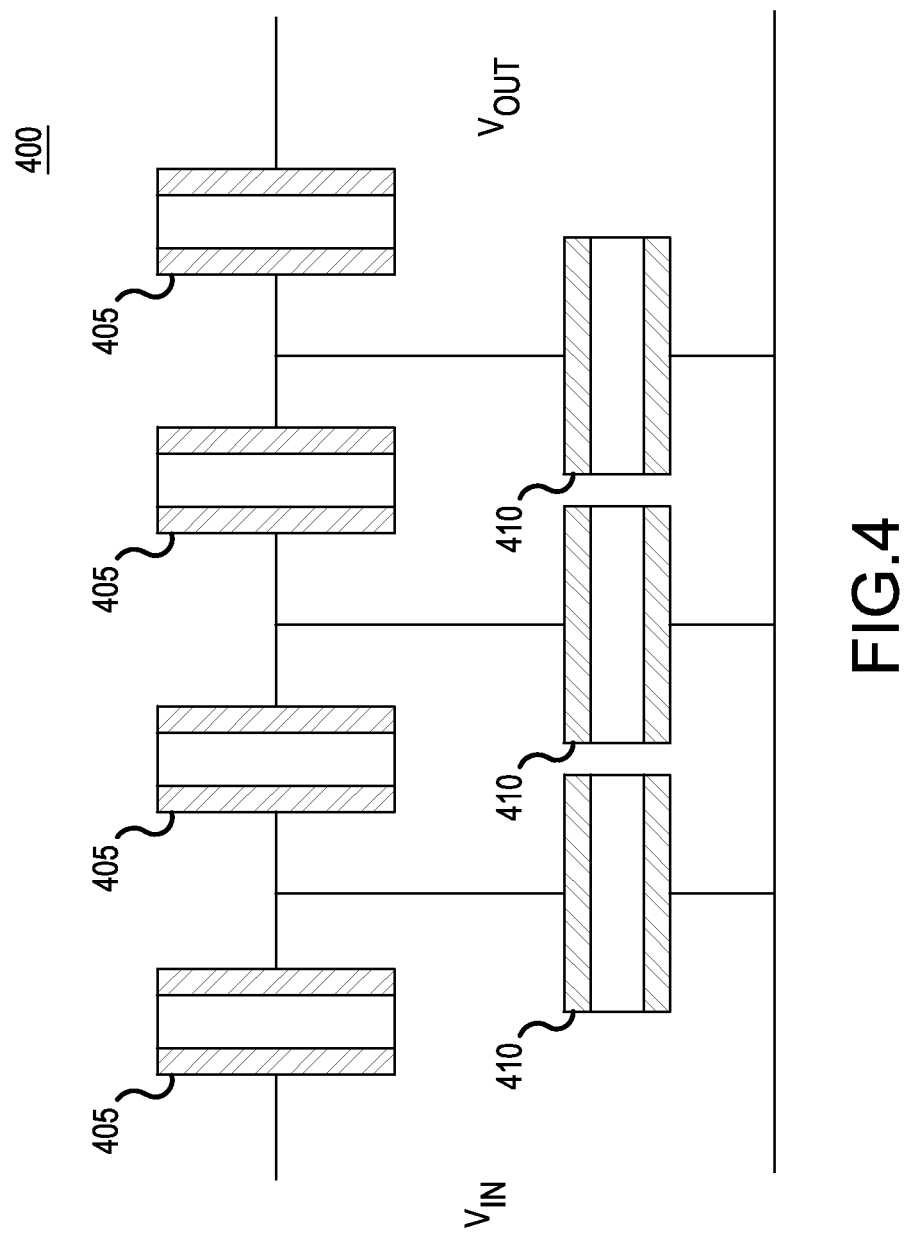
FIG. 4 is an electrical schematic of a ladder filter comprising multiple FBARs according to a representative embodiment.

FIG. 4 is an electrical schematic of a ladder filter 400 comprising multiple FBARs according to a representative embodiment. Ladder filter 400 could be used, for instance, in a duplexer circuit of a mobile telephone. Ladder filter 400 constitutes but one example of a structure that could be formed by an arrangement in which multiple structures are connected by a bottom electrical interconnect in an underlying dielectric. Such a structure could be implemented in a configuration illustrated in FIG. 2C, for example.

Referring to FIG. 4, ladder filter 400 comprises a plurality of series resonators 405 and a plurality of shunt resonators 410 connected between an input port and an output port, series resonators 405 have higher resonant frequencies than shunt resonators 410. Accordingly, they allow higher frequencies to pass through while shunting out lower frequencies. One or more electrical interconnects between acoustic resonators 405 and 410 can be formed by structures underlying the resonators, such as those illustrated in FIGS. 2-3.

Figure 5:
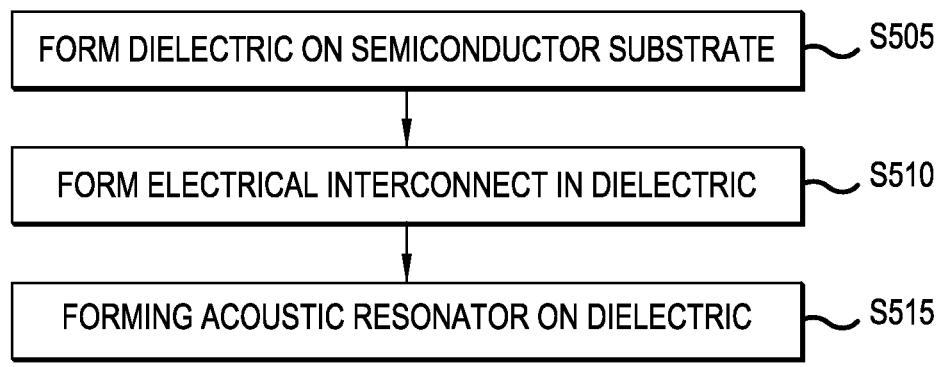
FIG. 5 is a flowchart illustrating a method of manufacturing an apparatus comprising an FBAR according to a representative embodiment.

FIG. 5 is a flowchart illustrating a method 500 of manufacturing an apparatus comprising an FBAR according to a representative embodiment. The illustrated method may be used to form an apparatus as described above with reference to FIGS. 2 through 4, although it is not limited to these apparatuses.

Referring to FIG. 5, the method comprises forming a dielectric (e.g., dielectric 210) on a silicon substrate (e.g., substrate 205) (S505). The dielectric typically comprises silicon carbide or a similar material. In general, the formation of the dielectric may comprise a collection of numerous processes that would be appreciated by those of ordinary skill in the art. For example, it may comprise depositing successive layers of dielectric material over the semiconductor substrate to encompass successive layers of the electrical interconnect.

The method further comprises forming an electrical interconnect in the dielectric, wherein the electrical interconnect is configured to transmit an electrical signal to or from at least one electrode of an acoustic resonator through a signal path disposed at least partially below a level of the acoustic resonator (S510). Like the dielectric, the formation of the electrical interconnect may comprise a collection of numerous processes as will be apparent to those of ordinary skill in the art. For example, it may comprise forming successive metal layers and intervening metal vias.

The method still further comprises forming an acoustic resonator on the dielectric (S515). The acoustic resonator may be, for instance, an FBAR as illustrated in FIG. 2 or 3, or it may be some other type of acoustic resonator. The method may further comprise the formation of additional acoustic resonators, e.g., in a ladder filter as illustrated in FIG. 4, or the formation of some other structure to be connected to the acoustic resonator via an interconnect. The formation of the acoustic resonator on the dielectric may comprise forming a sacrificial material within a cavity in the dielectric, forming the acoustic resonator on the dielectric and the sacrificial material, and removing the sacrificial material to create a cavity below the acoustic resonator. Removing the sacrificial material may comprise, for instance, immersing the dielectric and the acoustic resonator in acid.

As indicated by the foregoing, an apparatus may comprise an acoustic resonator with an electrical interconnect disposed in an underlying dielectric. The electrical interconnect may occupy a reduced amount of space compared to other types of interconnects used with acoustic resonators, and it may potentially facilitate different types of routing or routing to different types of components.

While example embodiments are disclosed herein, one of ordinary skill in the art appreciates that many variations that are in accordance with the present teachings are possible and remain within the scope of the appended claims. The embodiments therefore are not to be restricted except within the scope of the appended claims.

The invention claimed is:

1. An apparatus, comprising:
    a substrate;
    a dielectric disposed on the substrate;
    an acoustic resonator disposed on the dielectric, and disposed on a pedestal structure within an air cavity in the dielectric; and
    an electrical interconnect disposed in the dielectric and configured to transmit an electrical signal to or from at least one electrode of the acoustic resonator through a signal path disposed at least partially below a level of the acoustic resonator, wherein the acoustic resonator has an opening at its center, and a top electrode of the acoustic resonator is connected to the electrical interconnect through the opening.

2. The apparatus of claim 1, wherein the acoustic resonator is a film bulk acoustic resonator (FBAR).

3. The apparatus of claim 1, wherein the substrate is an electrical insulator.

4. The apparatus of claim 1, wherein the electrical interconnect connects an electrode of the acoustic resonator to an electrode of another acoustic resonator disposed on the dielectric.

5. The apparatus of claim 4, wherein the acoustic resonator and the other acoustic resonator are part of a filter comprising multiple acoustic resonators disposed on the dielectric.

6. The apparatus of claim 2, further comprising a layer of silicon carbide disposed between the dielectric and the air cavity.

7. The apparatus of claim 1, wherein the dielectric comprises silicon dioxide.

8. The apparatus of claim 1, wherein the electrical interconnect comprises a plurality of metal layers and vias stacked within the dielectric.

9. The apparatus of claim 1, wherein the electrical interconnect is connected to the acoustic resonator through the pedestal structure.

10. The apparatus of claim 1, further comprising a microcap disposed on the dielectric over the acoustic resonator.

11. The apparatus of claim 1, further comprising at least one backside via penetrating the substrate and providing an electrical connection between at least one electrode of the acoustic resonator and at least one backside pad on the substrate.

12. The apparatus of claim 1, wherein the acoustic resonator comprises a piezoelectric layer comprising scandium-doped aluminum oxide (ASN).

\* \* \* \* \*